(12) United States Patent
Yerrace et al.

(10) Patent No.: US 8,406,435 B2
(45) Date of Patent: Mar. 26, 2013

(54) AUDIO SUBMIX MANAGEMENT

(75) Inventors: Frank D. Yerrace, Woodinville, WA (US); Lawrence W Osterman, Woodinville, WA (US)

(73) Assignee: Microsoft Corporation, Redmond, WA (US)

( * ) Notice: Subject to any disclaimer, the term of this patent is extended or adjusted under 35 U.S.C. 154(b) by 1718 days.

(21) Appl. No.: 11/084,060

(22) Filed: Mar. 18, 2005

(65) Prior Publication Data

US 2006/0210097 A1    Sep. 21, 2006

(51) Int. Cl.
*H03G 3/00* (2006.01)
(52) U.S. Cl. ............... 381/109; 381/119; 369/3; 369/4; 715/727; 700/94
(58) Field of Classification Search ............... 381/119, 381/102–109, 81, 123; 700/94; 715/727, 715/839; 84/625, 660; 369/3–4
See application file for complete search history.

(56) References Cited

U.S. PATENT DOCUMENTS

| | | | |
|---|---|---|---|
| 5,204,969 A * | 4/1993 | Capps et al. | 704/278 |
| 6,301,666 B1 * | 10/2001 | Rive | 726/27 |
| 7,234,113 B1 * | 6/2007 | Matz et al. | 715/738 |
| 7,493,490 B2 * | 2/2009 | Tanner et al. | 713/176 |
| 2005/0129256 A1 * | 6/2005 | Metcalf | 381/119 |

OTHER PUBLICATIONS

Applicant's admitted prior art. Figure 1, pp. 1-4. No date available.*

* cited by examiner

*Primary Examiner* — Disler Paul
(74) *Attorney, Agent, or Firm* — Lee & Hayes, PLLC (57) ABSTRACT

Described herein are one or more implementations offering a centralized (e.g., single-point) user-interface, where a user may manipulate audio properties (e.g., volume level) for one or more audio submixes produced by each of multiple active operating-system processes.

20 Claims, 8 Drawing Sheets

Fig. 1
(background)

AUDIO SUBMIX MANAGEMENT

TECHNICAL FIELD

This invention generally relates to an audio management technology.

BACKGROUND

A general-purpose computer, particularly a personal computer, has the capability of conveying information to a user both visually and audibly. A number of different audio sources operating on the computer produce such audible information. The audio information includes, for example, voice annotations used with word processing programs, sound effects and music used with computer games, alert sounds produced by the computer's operating system or applications, and music from audio compact discs (CDs) or digital audio files (such as those commonly known as Windows Media Audio (WMA) or MPEG-1, Audio Layer 3 (MP3)).

The audio sources, including different applications, independently produce audio streams. However, due to limitations of the audio hardware, only one audio source can be played at one time. As a result, the system must properly select and mix the separate audio sources into a single output stream. In addition, because the audio streams originate from different audio sources, the resulting audio output signal may vary over a wide range of volume levels.

With conventional computers, the audio streams (produced by one or more active applications) are mixed at the operating system level. Mixing the audio streams at the operating system level is accomplished by delivering all audio streams to a single audio mixer, which adds the audio streams together and sends the sum, which is the audio output signal, to the sound card of the computer (then, of course, the signal is sent to speakers for output).

Figure 1:
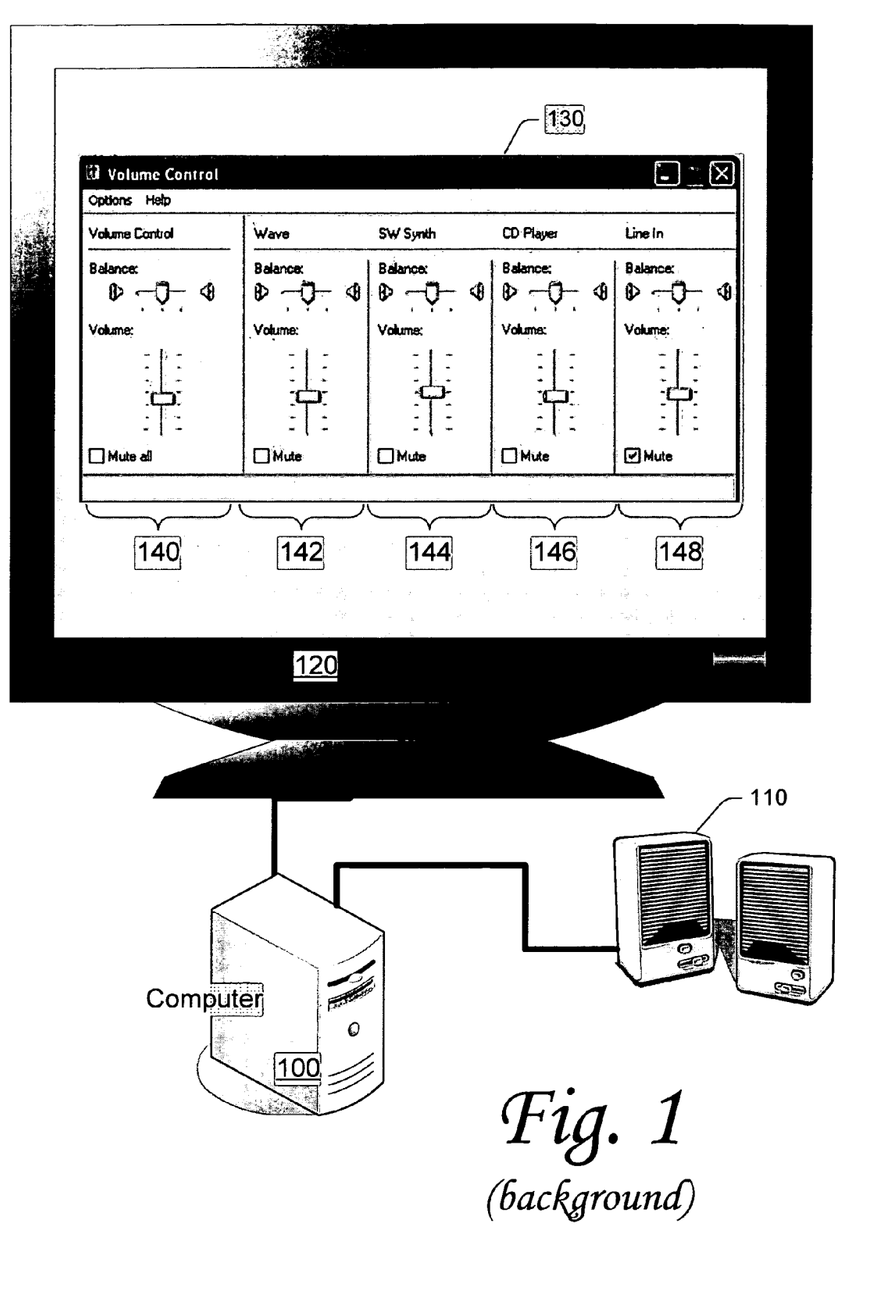
FIG. 1 shows an example of a conventional centralized volume control user-interface (UI).

FIG. 1 shows an example of a conventional audio management scenario. Specifically, a computer 100 has an audio output device 110 (e.g., speakers) and a monitor 120. Displayed on the monitor is a typical centralized volume control user-interface (UI) 130 offered by an operating system.

This conventional centralized volume control UI 130, depicted in FIG. 1, includes a "main" volume control 140 that affects the volume of the final audio output of the computer. In addition to the main volume control, the conventional centralized volume control UI 130 has a digital-audio volume control 142, a MIDI volume control 144, a CD-Player volume control 146, and a line-in volume control 148.

The digital-audio, or "Wave" volume control 142, affects the volume of digital audio samples often stored in so-called "wave" or "wav" files. The digital-audio volume control 142 also affects the volume of other digital audio samples stored in other formats, such as MP3, WMA. This format is commonly utilized by applications to produce alerts, beeps, and other notification and feedback sounds.

The MIDI, or "SW Synth" volume control 144, affects the volume of audio streams produced by MIDI devices or from MIDI files. MIDI (Musical Instrument Digital Interface) is an industry-standard interface used on electronic musical keyboards and personal computers for computer control of musical instruments and devices.

The CD-Player volume control 146 affects the volume of audio streams produced CD-ROM drives when they are "playing" audio CDs (when the computer is playing audio CDs using the analog audio interface). The line-in volume control 148 affects the volume level of incoming audio as heard through the output The conventional centralized volume control UI 130, depicted in FIG. 1, does not offer a user a mechanism for manipulating volume levels for audio streams produced by individual applications. Instead, the main volume control 140 ultimately affects the volume of all audio streams regardless of source. Moreover, the other volume controls are differentiated based upon the type of source, where the source types are limited to specific file formats (e.g., wave or midi) or specific hardware sources (e.g., midi device or CD-player).

Consequently, one of the ongoing problems that computer users face when dealing with audio is that each active application on the computer has its own concept of appropriate volume, but the user has no centralized and convenient mechanism for controlling the relative volume of the audio streams produced by each active application or process. This problem is typified by a common experience of listening to music at a reasonable level and being interrupted by seemingly loud new-mail or other alert notification on a user's computer. Another common scenario involves listening to a voice communications message (e.g., voice mail message) on a computer, but the vocal sounds are drowned out by the volume of the music playing on the multimedia player application on the computer.

Conventionally, each active application has the responsibility to manage its own volume. While some active applications choose to control their volume independently, many applications link their volume levels to the main volume of the operating system (e.g., the main volume control 140 depicted in FIG. 1). Unfortunately, in this situation, adjusting the volume for one application affects the volume level for all other active applications in the system. For example, turning up the volume level of the playback of digital music often results in an excessively loud new email notification.

Often applications choose to not expose any end user audio controls. For each of these applications, there is no user-adjustable volume control for the audio stream produced from such an application. However, many applications do expose application-specific volume control to the user. However, these volume controls are specific to the application. Therefore, for example, to adjust the volume of Application X, the user must navigate to Application X, find its volume-control user-interface (UI), and adjust the volume. The user must do this for each application in which she wishes to adjust audio volume.

In addition, occasionally it's not obvious which application is making the sound that the user hears. If she does not recognize the sound, she may be at a loss to find where it is coming from and how to stop or change it.

Moreoever, when an application starts, it typically starts with its volume set to maximum. This means that users often engage in an on-going battle to search volume-control UI for each application and tweak the volume of each application to achieve the desired audio mix. Sometimes, the user is at a loss, because there is no obvious mechanism to adjust the relative volume levels of the applications.

No conventional operating system offers a centralized (e.g., single-point) user-interface where a user may manipulate audio properties (e.g., volume level) for one or more coherent collections of audio streams produced by each of multiple active applications.

SUMMARY

Described herein are one or more implementations offering a centralized (e.g., single-point) user-interface where a user may manipulate audio properties (e.g., volume level) for one or more audio submixes produced by each of multiple active operating-system processes.

BRIEF DESCRIPTION OF THE DRAWINGS

The same numbers are used throughout the drawings to reference like elements and features.

DETAILED DESCRIPTION

Figure 2:
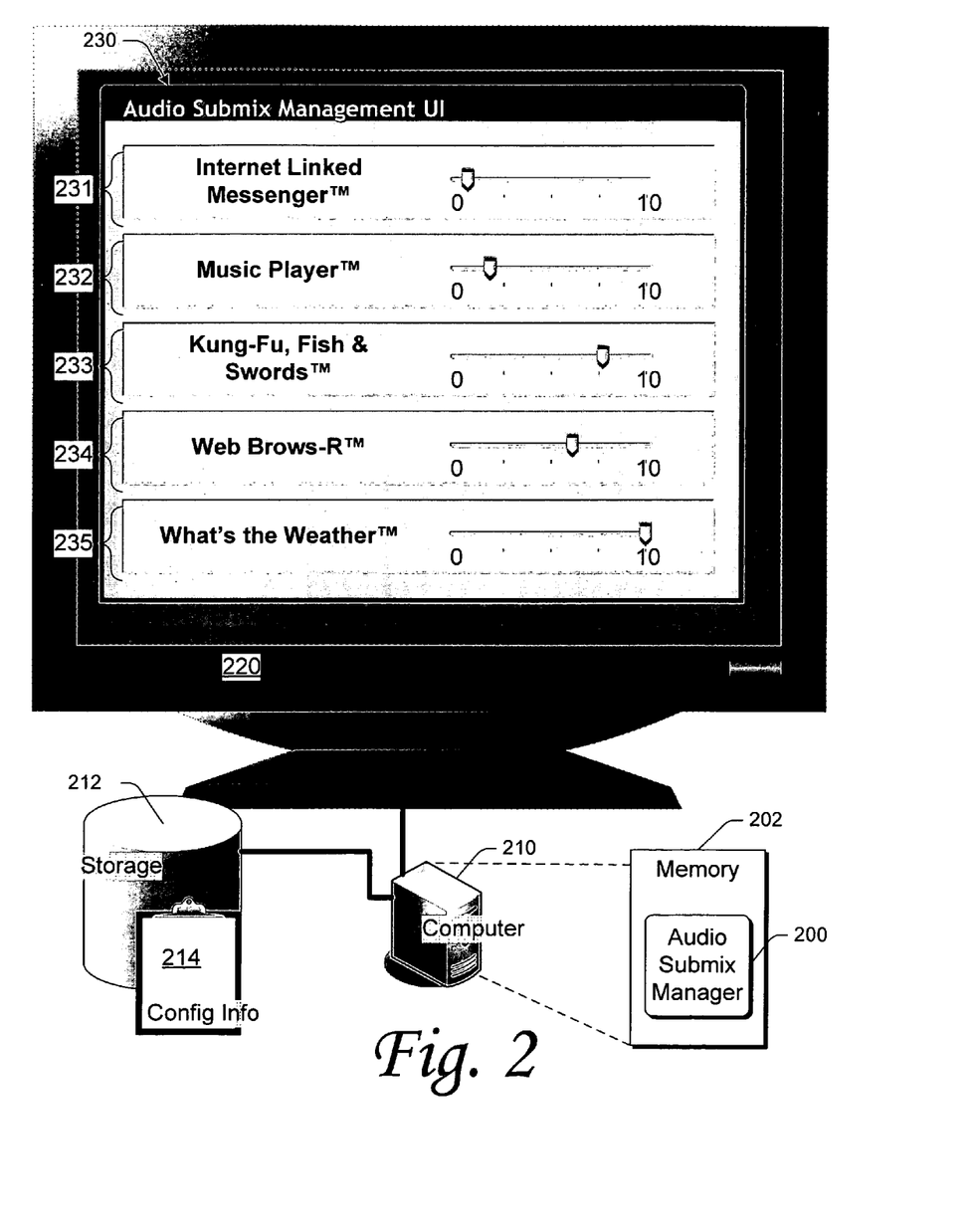
FIG. 2 shows an example of a user-interface (UI) of an audio-submix manager. This manager and its UI are in accordance with at least one implementation described herein.

One or more implementations, described herein, provide a centralized user-interface (e.g., a single-point UI) for a user to adjust audio properties (e.g., volume level) of one or more audio submixes produced by each of multiple applications. Furthermore, one or more implementations, described herein, classify the audio submixes produced by the applications and assigns relative audio properties to each classification. Further still, one or more implementations, described herein, define "audio policies," which are used to determine the relative audio properties of audio submixes based upon the current state of the computer system.
Exemplary Single-Point Per-Application Audio-Control UI FIG. 2 shows an example of an audio-submix manager 200 for centralized management of the audio properties (e.g., volume level) of one or more audio submixes produced by each of multiple applications. The audio-submix manager 200 itself is, for example, a program module executing within a primary memory system 202 (e.g., volatile or non-volatile memory) of a computer 210.

Figure 8:
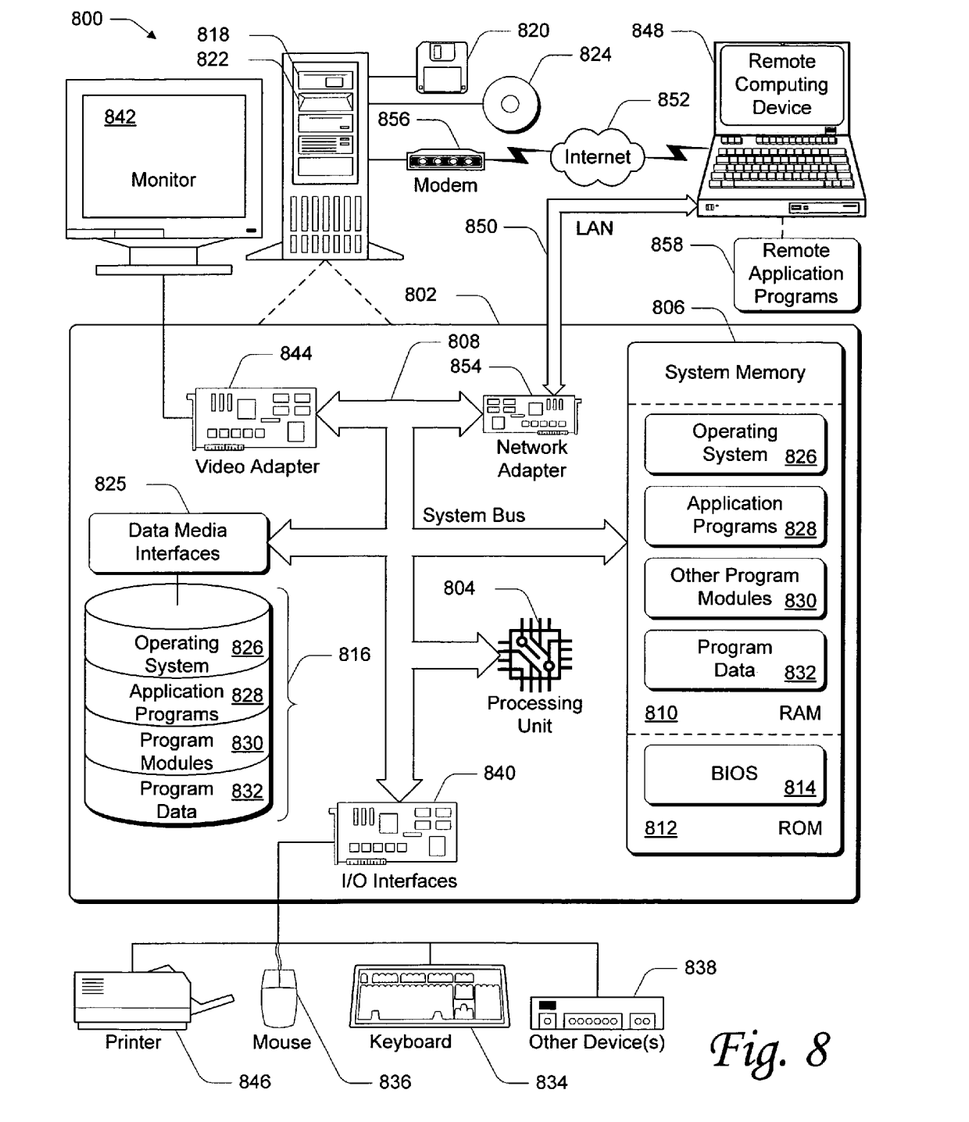
FIG. 8 is an example of a computing operating environment capable of (wholly or partially) implementing at least one embodiment described herein.

This computer may be a general- or special-purpose computer in this illustrated scenario. FIG. 8 depicts another computer system on which the audio-submix manager 200 may operate. Although not shown in FIG. 2, the computer 210 may be coupled to a network (e.g., a local area network (LAN), wide area network (WAN), the Internet, an intranet, etc.).

The computer 210 may be running a general- or specific-purpose operating system, which is capable of executing one or more applications, where each active application is one or more executing operating-system processes. Indeed, as used herein, an active application comprises one or more executing operating-system processes. Conversely, an active operating-system process comprises one active application or part of one active application. The audio-submix manager 200 may be an integrated portion of the OS or a separate but cooperative program module.

As depicted in FIG. 2, the computer 210 has access to a storage system 212 for storing files, data, and the like. Stored on that storage system is one or more files (e.g., a "registry") of configuration information 214 regarding the programs and services installed and/or active on the computer. In addition, the computer 210 is connected to a computer monitor 220 for displaying, for example, a user-interface (UI) 230.

The UI 230 is an example of just one UI which might be generated by the audio-submix manager 200 for audio-submix management. At 231-235, UI 230 displays an enumerated list of audio-submixes with their associated applications. The names of these associated applications shown in the enumerated list are fictitious and do not refer to any actual products. Note that these fictitious names include "TM" indications, which simulate a trademark indication. However, no assertion is made, herein, that these application names are actually trademarked.

The enumerated item 231, for example, includes an application named "Internet Linked Notifier™", which is presumably the name of an application that provides instant messaging over the Internet. Item 231 has a user-adjustable volume-control slider bar. It is currently set at or near "0." That indicates that the relative volume of the audio submix produced by the one or more processes (when active) that comprise the application named "Internet Linked Notifier™" is near zero.

The enumerated item 232, for example, includes an application named "Music Player™," which is presumably a player of digital music files. The enumerated item 233, for example, includes an application named "Kung-Fu, Fish & Swords™." which is presumably a video game. The enumerated item 234, for example, includes an application named "Web Brows-R™," which is presumably web browser. The enumerated item 235, for example, includes a monitoring application named "What's the Weather™," which presumably provides weather updates.

Each of these enumerated items 231-235 has an associated volume control for the user to adjust the relative volume of the submix associated with it. The volume of each submix may be adjusted separately and independently of the others. For example, the adjustment of the volume of the "Web Brows-R™" browser does not affect the volume of the "Kung-Fu, Fish & Swords™" game.

Herein, an audio submix is a coherent collection of one or more audio streams. Those of ordinary skill in the art understand an "audio stream" to be set of audio samples delivered to an audio device. In order to continuously play audio, new samples are presented to the audio device on a regular basis. Therefore, that continuous "stream" of samples is called an audio stream.

Each submix has audio properties (e.g., volume level) and the audio properties of each submix are adjustable independently from the adjustment of properties of other submixes. Herein, an active application comprises one or more active operating-system processes. Furthermore, each audio submix is associated with one active process, and such process is typically the source of the audio submix. However, each active process may be associated with (and typically the source of) one or more submixes.

Figure 3:
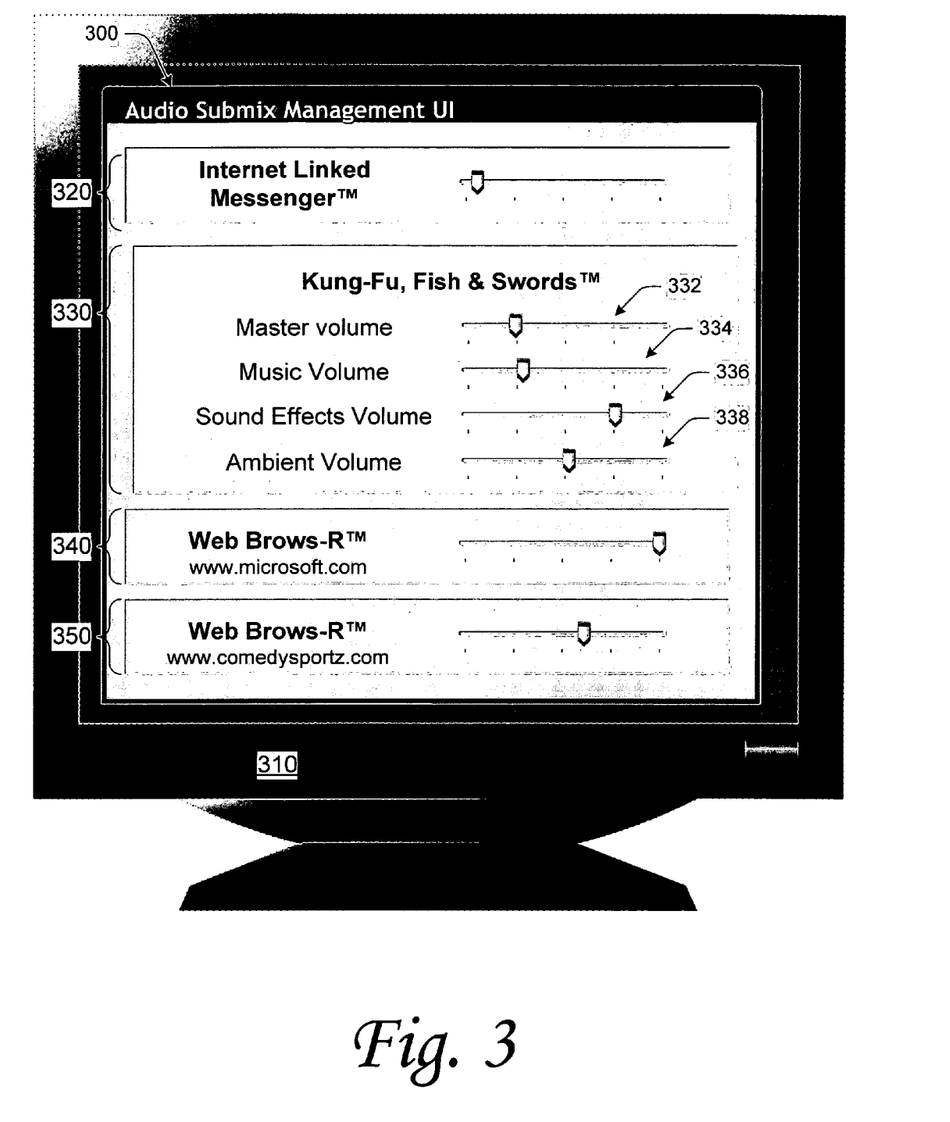
FIG. 3 shows an example of a UI in accordance with at least one implementation described herein.

FIG. 3 shows an example of another UI 300 displayed on a monitor 310. The audio-submix manager 200 may generate this UI 300. At 320, the UI 300 displays the volume control for the above-introduced application named "Internet Linked Notifier™." However, item 330 shows an alternative presentation for the above-introduced application named "Kung-Fu, Fish & Swords™."

Instead of just one volume control, item 330 presents four different volume controls. Slider control 332 controls the volume of "master" or "final" submix produced by the application named "Kung-Fu, Fish & Swords™." Since it may be redundant with another volume control in another UI, some implementations might not include a volume control for the master submix in this UI. Slider control 334 controls the volume of a "music" submix produced by the application. While slider control 336 controls the volume of a "sound effects" submix produced by the application, slider control 338 the volume of an "ambient" submix produced by the application.

In this example, "Kung-Fu, Fish & Swords™" is an application composed of just one operating-system process or composed of multiple processes. The application exposes four audio submixes for the audio-submix manager 200 to find and manage. In the example shown in FIG. 3, the audio-submix manager 200 presents controls for the four submixes exposed by the application and does so under a common heading for that application, namely "Kung-Fu, Fish & Swords™."

Items 340 and 350 show another exemplary alternative presentation for multiple submixes related to the same application or process. Both of these items (340 and 350) refer to the same application, which is the above-introduced application named "Web Brows-R™." However, each item represents a different operating-system process of that application. In this example, item 340 represents the volume control for one web page (specifically, one located at "www.microsoft.com"), and item 350 represents the volume control for another web page (specifically, one located at "www.comedysportz.com").

Each audio submix has a unique submix "ID" or "name." The submix ID might simply be the name of the application or process producing the submix. However, if the application or process is producing multiple submixes, then the ID may include additional identifying information. For example, the submix ID associated with slider control 336 may include the application name "Kung-Fu, Fish & Swords™" and a name like "sound effect" to specify the particular content of that submix.

In at least one implementations, the audio-submix manager 200 manages audio submixes (such as those presented in the UI 230 of FIG. 2 and the UI 300 of FIG. 3) that are associated with active (that is, executing) applications and processes. In other words, each managed submix is being produced by a process or application executing on the computer 210.

In an alternative implementations, the audio-submix manager 200 manages audio submixes (such as those presented in the UI 230 of FIG. 2 and the UI 300 of FIG. 3) that are currently and/or have recently been audible. In other words, each managed submix is either currently audible or was recently audible. Herein, the range for "recently" in the context of "recently audible" means within the past three hours. In some implementation, "recently" may be limited to the last thirty minutes. In still other implementation, "recently" may be limited to the past ten minutes or less.

Alternatively still, one or more of the managed submixes may be associated with an inactive (that is, non-executing) application or operating-system process. Although inactive, the applications and/or processes with managed submixes are installed and configured on the computer 210. Configuration data regarding submixes and their current state (e.g., volume level) is stored in, for example, the registry 214 of configuration information.

When a submix is instantiated (for example, when its associated application is executed), computer 210 sets the initial volume for the just-initiated submix to the volume level indicated by its associated configuration information in the registry 214. Consequently, the audio-submix manager 200 facilitates the persistence (i.e., storing) of volume settings for each installed/registered application or process.

In one implementation, the audio-submix manager 200 displays a volume-control UI for the submixes of all installed/registered applications or processes or a subset of such. In addition, the audio-submix manager 200 displays a volume-control UI for the submixes of all active applications or processes or a subset of such. In another implementation, the audio-submix manager 200 displays a volume-control UI for the submixes of installed/registered, but currently inactive, applications or processes when such have been recently deactivated (e.g., 30 second ago).

Submix Classification

Figure 4:
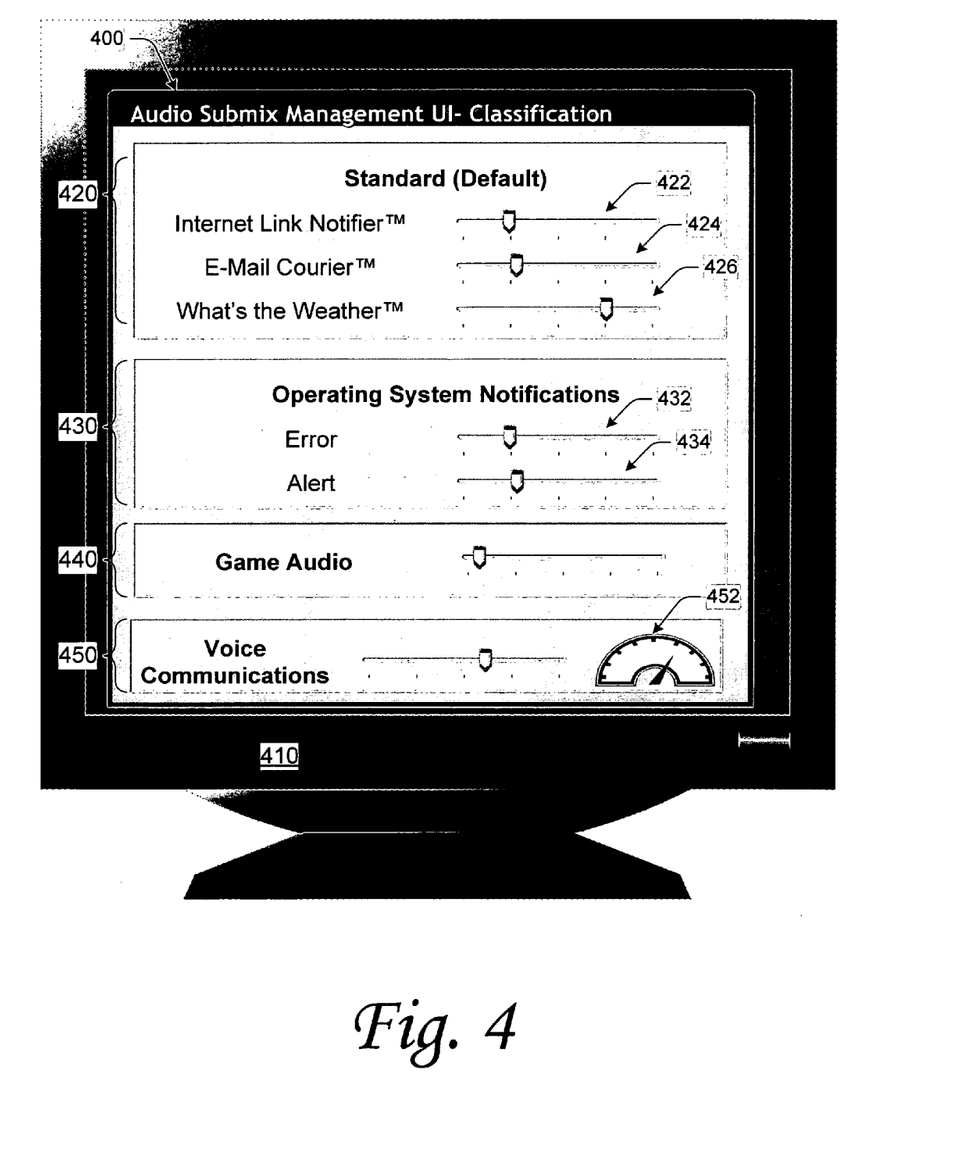
FIG. 4 shows an example of a UI in accordance with at least one implementation described herein.

FIG. 4 shows an example of another UI 400 displayed on a monitor 410. The audio-submix manager 200 may generate this UI 400, which is one that displays submixes in a categorized manner. An assigned category or class may be amongst the configuration data associated with each submix and/or its application/process. The following are examples of five possible classifications: Standard (or default), Operating-System Notification, Game Audio, Media/Entertainment, and Voice Communication.

At 420, the UI 400 displays the volume control submixes classified as "standard." In particular, item 420 lists the specific submixes classified as such and provides volume control for each submix. Specifically, the "standard" classified submixes includes those related to "Internet Linked Notifier™" 422, "E-mail Courier™" 424, and "What's the Weather™" 426.

At 430, the UI 400 displays the volume control submixes classified as "Operating System Notification," Specifically, the notification classified submixes includes those related to Errors 432 and Alerts 424.

Instead of listing separate volume controls for each classified submix, item 440 presents master volume control for all submixes classified as "Game Audio." This is an alternative manner to presenting volume control for like-classified submixes. Similarly, item 450 provides a master volume control for all submixes classified as "Voice Communications."

FIG. 4 shows that the UI displays another audio property at 452. In particular, the audio meter at 452 displays the current audio volume levels. While much of the discussion herein focuses on relative volume of audio submixes, the audio-submix manager 200 also covers other audio properties such as mute, meter, display name, current state (playing or not playing audio), the time that the transition between playing and not playing occurred, the path of the file being played, category, automatic volume changes applied by the system's policies, and human-readable friendly name, etc.

Policies

The classification system facilities the audio-submix manager 200 in implementing automatic audio policies on the computer 210. Based upon the state of the overall system (the operating system and the applications, processes, and services running there on), the audio-submix manager 200 automatically adjusts the relative volume settings (or other audio properties) of one or more submixes.

For example, the audio-submix manager 200 may implement "ducking" to allow voice to be better heard. Ducking (e.g., automatic volume control) is when music and other non-voice audio is lowered while a voice audio is playing. After the voice audio is finished, the other non-voice audio is restored.

Ducking may occur when an application starts a submix configured as a voice communications submix. Then the manager 200 will automatically reduce the volume of all the non-voice submixes by a pre-determined amount (e.g., 20 dB). As a result, all audio is automatically reduced in favor of the voice communication, regardless of application volume.

When a user leaves his/her computer unattended while audio that is confidential is playing, that confidential audio may be overheard by an unauthorized passer-by or intruder. Therefore, all audio emitting from that application is muted when a user's session ends or is locked or switched. The audio will be restored when the session is restored. Similarly, there may be policy that prevents an application, which is not part of an active user session, to capture audio.

It may be useful to have a time-trigger policy. In this instance, the volume of one or more classifications (or of specific submixes) may be reduced or increased based on the current time. In addition, audio policies may be implemented across a network amongst a collection of administered network computers.

Exemplary Audio-Submix Manager

Figure 5:
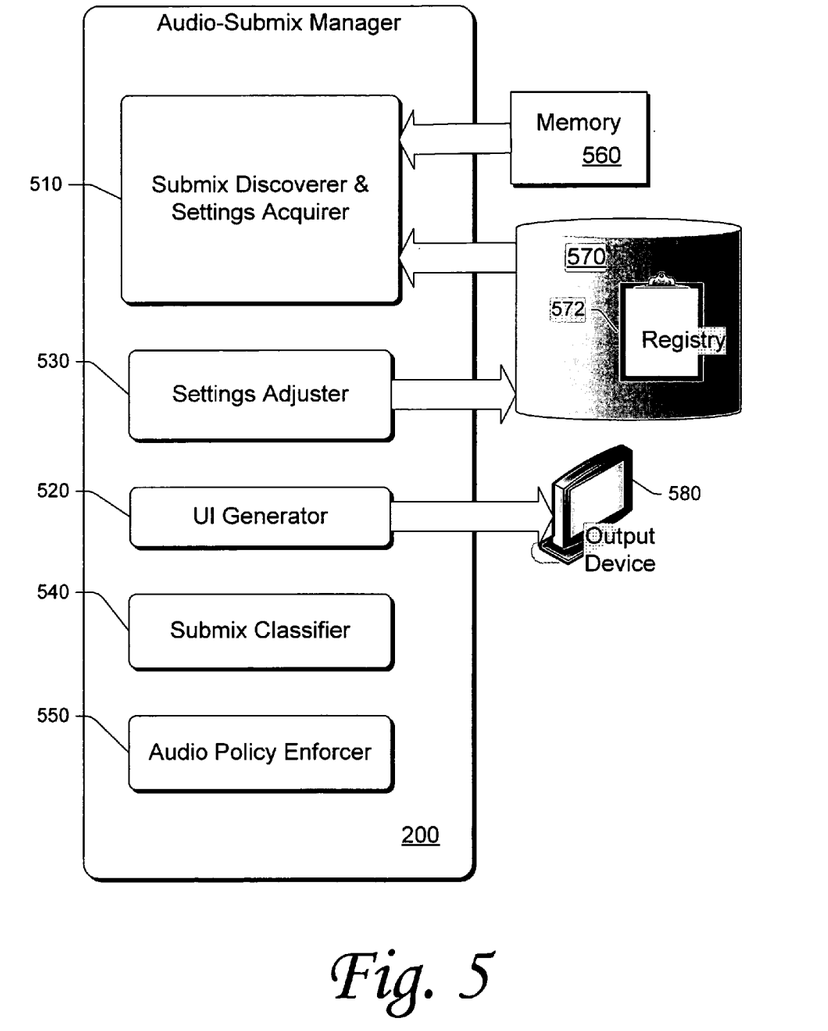
FIG. 5 shows operational components of an exemplary tool for configuration and management of server-functionality roles in accordance with at least one implementation described herein.

FIG. 5 illustrates operational components of the audio-submix manager 200. Because this is the same audio-submix manager 200 discussed and referenced in FIG. 2, the audio-submix manager shown in FIG. 5 retains the 200 reference designator. Although the operational components of FIG. 5 are shown as being part of the manager 200, those of ordinary skill in the art understand the each operational component and sub-component may be incorporated into one or more entities other than the audio-submix manager.

As shown in FIG. 5, the components of the audio-submix manager 200 include a submix discoverer & settings acquirer 510, a settings adjuster 530, a UI generator 520, a submix classifier 540, and an audio policy enforcer 550.

The submix discoverer & settings acquirer 510 discovers available audio submixes, which may include the submixes of some or all of the active applications and/or processes and some or all of the inactive installed/registered applications and/processes. It discovers this by examining the active applications and/or processes in a memory 560 of a computer and examining configuration information found on a storage system 570. This configuration information may be found in one or more files, commonly called a registry 572.

The submix discoverer & settings acquirer 510 also acquires the current setting of the desired audio properties (e.g., volume) for available submixes. It acquires them from the memory 560 or the registry 572.

The UI generator 520 generates and displays a UI (such as UIs 230, 300, or 400) for displaying and possibly controlling the desired audio properties (e.g., volume) for available submixes. Once a UI is generated, the UI generator 520 displays it on a monitor, such as monitor UI generator 580.

The settings adjuster 530 adjusts the desired audio properties (e.g., volume) for a submix in response to a user adjusting the property via the generated UI. The manager may adjust the current setting persisted in the registry.

The submix classifier 540 classifies the available submixes. This may be in response to user-adjusted settings or it may be pre-configured.

The audio policy enforcer 550 sets one or more automatic audio policies and monitors the current state of the computer and responds when such state triggers an audio policy.

Methodological Implementations

Figure 6:
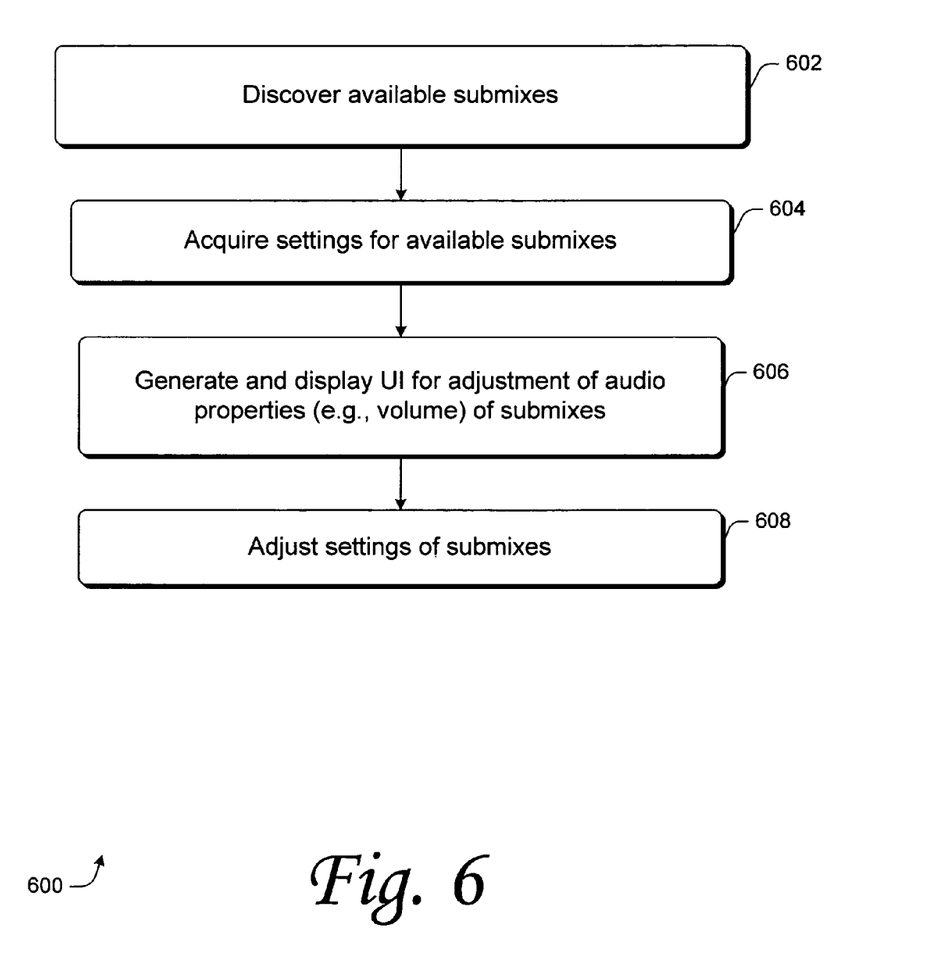
FIG. 6 illustrates a flow diagram showing a methodological implementation described herein.

FIG. 6 shows an audio-submix management method 600 performed by the audio-submix manager 200. This audio-submix management method 600 may be performed in software, hardware, or a combination thereof. For ease of understanding, the method is delineated as separate steps represented as independent blocks in FIG. 6; however, these separately delineated steps should not be construed as necessarily order dependent in their performance. Additionally, for discussion purposes, the method 600 is described with reference to FIG. 2.

At 602 of FIG. 6, the audio-submix manager 200 discovers available audio submixes, which may include the submixes of some or all of the active applications and/or processes and some or all of the inactive installed/registered applications and/processes.

At 604, the audio-submix manager 200 acquires the current setting of the desired audio properties (e.g., volume) for available submixes.

At 606, the audio-submix manager 200 generates and displays a UI for controlling the desired audio properties (e.g., volume) for available submixes.

At 608, the audio-submix manager adjusts the desired audio properties (e.g., volume) for a submix, in response to a user adjusting the property via the generated UI. The manager may adjust the current setting persisted in the registry.

Figure 7:
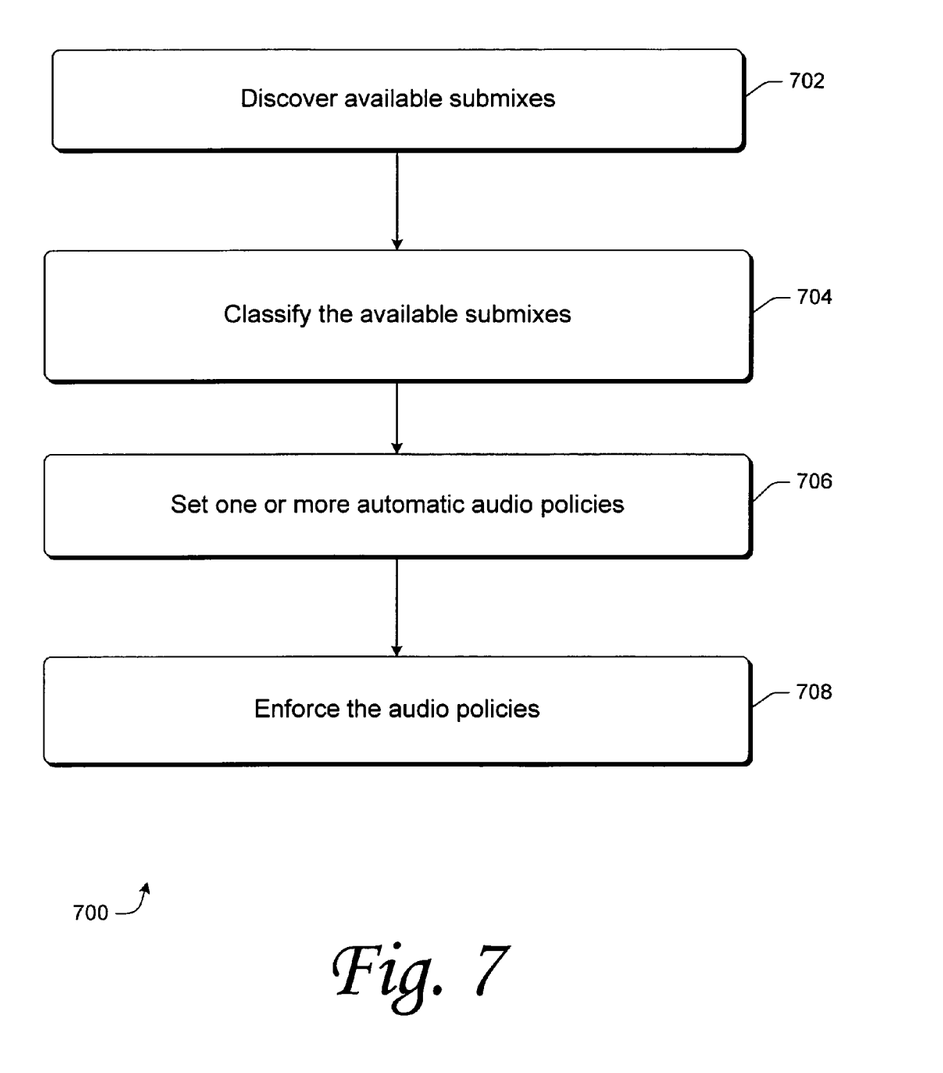
FIG. 7 illustrates a flow diagram showing a methodological implementation described herein.

FIG. 7 shows an audio-submix management method 700 performed by the audio-submix manager 200. This management method 700 may be performed in software, hardware, or a combination thereof. For ease of understanding, the method is delineated as separate steps represented as independent blocks in FIG. 7; however, these separately delineated steps should not be construed as necessarily order dependent in their performance. Additionally, for discussion purposes, the method 700 is described with reference to FIGS. 2 and 3.

At 702 of FIG. 7, the audio-submix manager 200 discovers available audio submixes, which may include the submixes of some or all of the active applications and/or processes and some or all of the inactive installed/registered applications and/processes.

At 704, the audio-submix manager 200 classifies the available submixes. This may be in response to user-adjusted settings or it may be pre-configured.

At 706, the audio-submix manager 200 sets one or more automatic audio policies.

At 708, the audio-submix manager monitors the current state of the computer and responds when such state triggers an audio policy. Thus, it enforces the policies.

Exemplary Computing System and Environment

FIG. 8 illustrates an example of a suitable computing environment 800 within which an exemplary audio-submix manager, such as the audio-submix manager 200 as described herein, may be implemented (either fully or partially). The computing environment 800 may be utilized in the computer and network architectures described herein.

The exemplary computing environment 800 is only one example of a computing environment and is not intended to suggest any limitation as to the scope of use or functionality of the computer and network architectures. Neither should the computing environment 800 be interpreted as having any dependency or requirement relating to any one or combination of components illustrated in the exemplary computing environment 800.

The exemplary audio-submix manager may be implemented with numerous other general purpose or special purpose computing system environments or configurations. Examples of well known computing systems, environments, and/or configurations that may be suitable for use include, but are not limited to, personal computers, server computers, thin clients, thick clients, hand-held or laptop devices, multiprocessor systems, microprocessor-based systems, set top boxes, personal digital assistants (PDA), appliances, special-purpose electronics (e.g., a DVD player), programmable consumer electronics, network PCs, minicomputers, mainframe computers, distributed computing environments that include any of the above systems or devices, and the like.

The exemplary audio-submix manager may be described in the general context of computer-executable instructions, such as program modules, being executed by a computer. Generally, program modules include routines, programs, objects, components, data structures, etc. that perform particular tasks or implement particular abstract data types. The exemplary audio-submix manager may also be practiced in distributed computing environments where tasks are performed by remote processing devices that are linked through a data-communications network. In a distributed computing environment, program modules may be located in both local and remote computer storage media including memory storage devices.

The computing environment 800 includes a general-purpose computing device in the form of a computer 802. The components of computer 802 may include, but are not limited to, one or more processors or processing units 804, a system memory 806, and a system bus 808 that couples various system components, including the processor 804, to the system memory 806.

The system bus 808 represents one or more of any of several types of bus structures, including a memory bus or memory controller, a peripheral bus, an accelerated graphics port, and a processor or local bus using any of a variety of bus architectures. By way of example, such architectures can include a CardBus, Personal Computer Memory Card International Association (PCMCIA), Accelerated Graphics Port (AGP), Small Computer System Interface (SCSI), Universal Serial Bus (USB), IEEE 1394, a Video Electronics Standards Association (VESA) local bus, and a Peripheral Component Interconnects (PCI) bus, also known as a Mezzanine bus.

Computer 802 typically includes a variety of computer-readable media. Such media may be any available media that is accessible by computer 802 and includes both volatile and non-volatile media, removable and non-removable media.

The system memory 806 includes computer-readable media in the form of volatile memory, such as random access memory (RAM) 810, and/or non-volatile memory, such as read only memory (ROM) 812. A basic input/output system (BIOS) 814, containing the basic routines that help to transfer information between elements within computer 802, such as during start-up, is stored in ROM 812. RAM 810 typically contains data and/or program modules that are immediately accessible to and/or presently operated on by the processing unit 804.

Computer 802 may also include other removable/non-removable, volatile/non-volatile computer storage media. By way of example, FIG. 8 illustrates a hard disk drive 816 for reading from and writing to a non-removable, non-volatile magnetic media (not shown), a magnetic disk drive 818 for reading from and writing to a removable, non-volatile magnetic disk 820 (e.g., a "floppy disk"), and an optical disk drive 822 for reading from and/or writing to a removable, non-volatile optical disk 824 such as a CD-ROM, DVD-ROM, or other optical media. The hard disk drive 816, magnetic disk drive 818, and optical disk drive 822 are each connected to the system bus 808 by one or more data media interfaces 825. Alternatively, the hard disk drive 816, magnetic disk drive 818, and optical disk drive 822 may be connected to the system bus 808 by one or more interfaces (not shown).

The disk drives and their associated computer-readable media provide non-volatile storage of computer readable instructions, data structures, program modules, and other data for computer 802. Although the example illustrates a hard disk 816, a removable magnetic disk 820, and a removable optical disk 824, it is to be appreciated that other types of computer-readable media, which may store data that is accessible by a computer, such as magnetic cassettes or other magnetic storage devices, flash memory cards, CD-ROM, digital versatile disks (DVD) or other optical storage, random access memories (RAM), read only memories (ROM), electronically erasable programmable read-only memory (EEPROM), and the like, may also be utilized to implement the exemplary computing system and environment.

Any number of program modules may be stored on the hard disk 816, magnetic disk 820, optical disk 824, ROM 812, and/or RAM 810, including, by way of example, an operating system 826, one or more application programs 828, other program modules 830, and program data 832.

A user may enter commands and information into computer 802 via input devices such as a keyboard 834 and a pointing device 836 (e.g., a "mouse"). Other input devices 838 (not shown specifically) may include a microphone, joystick, game pad, satellite dish, serial port, scanner, and/or the like. These and other input devices are connected to the processing unit 804 via input/output interfaces 840 that are coupled to the system bus 808, but may be connected by other interface and bus structures, such as a parallel port, game port, or a universal serial bus (USB).

A monitor 842 or other type of display device may also be connected to the system bus 808 via an interface, such as a video adapter 844. In addition to the monitor 842, other output peripheral devices may include components, such as speakers (not shown) and a printer 846, which may be connected to computer 802 via the input/output interfaces 840.

Computer 802 may operate in a networked environment using logical connections to one or more remote computers, such as a remote computing device 848. By way of example, the remote computing device 848 may be a personal computer, a portable computer, a server, a router, a network computer, a peer device or other common network node, and the like. The remote computing device 848 is illustrated as a portable computer that may include many or all of the elements and features described herein, relative to computer 802.

Logical connections between computer 802 and the remote computer 848 are depicted as a local area network (LAN) 850 and a general wide area network (WAN) 852. Such networking environments are commonplace in offices, enterprise-wide computer networks, intranets, and the Internet. Such networking environments may be wired or wireless.

When implemented in a LAN networking environment, the computer 802 is connected to a local network 850 via a network interface or adapter 854. When implemented in a WAN networking environment, the computer 802 typically includes a modem 856 or other means for establishing communications over the wide network 852. The modem 856, which may be internal or external to computer 802, may be connected to the system bus 808 via the input/output interfaces 840 or other appropriate mechanisms. It is to be appreciated that the illustrated network connections are exemplary and that other means of establishing communication link(s) between the computers 802 and 848 may be employed.

In a networked environment, such as that illustrated with computing environment 800, program modules depicted, relative to the computer 802 or portions thereof, may be stored in a remote memory storage device. By way of example, remote application programs 858 reside on a memory device of remote computer 848. For purposes of illustration, application programs and other executable program components, such as the operating system, are illustrated herein as discrete blocks, although it is recognized that such programs and components reside at various times in different storage components of the computing device 802, and are executed by the data processor(s) of the computer.

Computer-Executable Instructions

An implementation of an exemplary audio-submix manager may be described in the general context of computer-executable instructions, such as program modules, executed by one or more computers or other devices. Generally, program modules include routines, programs, objects, components, data structures, etc. that perform particular tasks or implement particular abstract data types. Typically, the functionality of the program modules may be combined or distributed as desired in various embodiments.

Exemplary Operating Environment

FIG. 8 illustrates an example of a suitable operating environment 800 in which an exemplary audio-submix manager may be implemented. Specifically, the exemplary audio-submix manager(s) described herein may be implemented (wholly or in part) by any program modules 828-830 and/or operating system 826 in FIG. 8, or a portion thereof.

The operating environment is only an example of a suitable operating environment and is not intended to suggest any limitation as to the scope herein. Other well known computing systems, environments, and/or configurations that are suitable for use include, but are not limited to, personal computers (PCs), server computers, hand-held or laptop devices, multiprocessor systems, microprocessor-based systems, programmable consumer electronics, wireless phones and equipment, general and special-purpose appliances, application-specific integrated circuits (ASICs), network PCs, minicomputers, mainframe computers, distributed computing environments that include any of the above systems or devices, and the like.

Computer-Readable Media

An implementation of an exemplary audio-submix manager may be stored on or transmitted across some form of computer-readable media. Computer-readable media may be any available media that may be accessed by a computer. By way of example, computer-readable media may comprise, but is not limited to, "computer storage media" and "communications media."

"Computer storage media" include volatile and non-volatile, removable and non-removable media implemented in any method or technology for storage of information such as computer readable instructions, data structures, program modules, or other data. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by a computer.

"Communication media" typically embodies computer-readable instructions, data structures, program modules, or other data in a modulated data signal, such as carrier wave or other transport mechanism. Communication media also includes any information delivery media.

CONCLUSION

The techniques, described herein, may be implemented in many ways, including (but not limited to) program modules, general- and special-purpose computing systems, network servers and equipment, dedicated electronics and hardware, and as part of one or more computer networks. The techniques may, for example, be implemented on a computer system depicted in FIG. 8.

Although the one or more above-described implementations have been described in language specific to structural features and/or methodological steps, it is to be understood that other implementations may be practiced without the specific features or steps described. Rather, the specific features and steps are disclosed as preferred forms of one or more implementations.

The invention claimed is:

1. In a computer configured to accommodate multiple audio submixes, a method comprising the acts of: discovering multiple audio submixes exposed to an operating system of a computer, each audio submix being a coherent collection of one or more audio streams and each audio submix having adjustable audio properties, at least a portion of the adjustable audio properties being stored in a configuration store associated with the computer, and the discovering includes examining the configuration store; classifying each of the multiple discovered audio submixes into one of a plurality of assigned classifications, (insert as underlined) wherein at least a first audio submix is classified into a first assigned classification and at least a second audio submix is classified into a second assigned classification different than the first assigned classification; producing a user-interface (UI) listing the multiple discovered audio submixes based on the assigned classification, with user-adjustable controls configured to enable a user to adjust audio properties of each of the multiple discovered submixes, wherein adjustments for one submix are independent from adjustments of audio properties of other submixes, and wherein the UI displays the adjustable audio properties and the displayed adjustable audio properties are based on saved values of the adjustable audio properties, the saved values determined based on previous user adjustments of the adjustable audio properties; and in response to an adjustment for one submix, adjusting the audio properties of that submix so that such adjustment is independent from adjustments of audio properties of other submixes, wherein one or more of the multiple discovered audio submixes are associated with an inactive application, but the inactive application is installed or configured on the computer.

2. A method as recited in claim 1, wherein the adjustable audio properties of the audio submixes comprise volume.

3. A method as recited in claim 1, wherein one or more of the multiple discovered audio submixes are associated with an active operating-system process.

4. A method as recited in claim 1, wherein one or more of the multiple discovered audio submixes are associated with an active application, the active application being comprised of one or more active operating-system processes.

5. A method as recited in claim 1, wherein one or more of the multiple discovered audio submixes comprises currently audible submixes.

6. A method as recited in claim 1, wherein one or more of the multiple discovered audio submixes comprises recently audible submixes, which have been audible within a most recent three hour history.

7. A method as recited in claim 1, wherein one or more of the multiple discovered audio submixes comprises recently audible submixes, which have been audible within a most recent thirty-minute history.

8. A method as recited in claim 1, wherein the discovering comprises examining a memory of the computer, the memory holding executing operating-system processes.

9. A method as recited in claim 1, further comprising displaying the generated UI.

10. A method as recited in claim 1, wherein the plurality of assigned classifications comprise:
  game audio;
  media and entertainment audio; and
  voice communication audio.

11. A method as recited in claim 1, further comprising implementing automatic audio control policies that increases volume for audio submixes with voice and decreases volume for audio submixes without voice.

12. A method comprising: discovering multiple audio submixes on a computer; assigning each of the multiple audio submixes into one of a plurality of classifications, (insert as underline) wherein at least a first audio submix is assigned to a first classification and at least a second audio submix is assigned to a second classification different than the first classification; and producing a user-interface (UI) for the multiple audio submixes with user-adjustable controls, each audio submix being a coherent collection of one or more audio streams associated with at least one operating-system process or application, and each audio submix having adjustable audio properties, the adjustable audio properties including volume, the UI being configured to enable a user to individually adjust audio properties of one or more of the multiple audio submixes or to adjust master control audio properties for a classification including a subset of the multiple audio submixes, wherein adjustments for one audio submix or a classification are independent from adjustments of other audio submixes or other classifications.

13. A method as recited in claim 12, wherein one or more of the audio submixes are associated with an active operating-system process.

14. A method as recited in claim 12, wherein one or more of the multiple audio submixes are associated with an active application, the application being comprised of one or more active operating-system processes.

15. A method as recited in claim 12, wherein at least one audio submix is associated with a corresponding web page of a browser installed on the computer.

16. One or more computing devices storing executable instructions that, when executed, perform operations comprising: discovering multiple audio submixes on the computer, wherein each audio submix is a collection of one or more audio streams and each audio submix has audio properties at least a portion of which are stored in a configuration store associated with the computer; assigning each of the multiple audio submixes to at least one of a plurality of classifications, (insert as underline) wherein at least a first audio submix is assigned to a first classification and at least a second audio submix is assigned to a second classification different than the first classification; and generating a user-interface configured to display adjustable audio properties for the multiple audio submixes based at least in part on the classification assigned to each audio submix, wherein the adjustable audio properties for at least the first classification are provided for each individual audio submix assigned to the first classification and the adjustable audio properties for at least the second classification are provided by a classification master control for the audio submixes assigned to the second classification.

17. The one or more computing devices of claim 16, wherein assigning each of the multiple audio submixes to at least one of the plurality of submixes is based on configuration data of the audio submix or an application category of the audio submix.

18. The one or more computing devices of claim 16, wherein at least one audio submix is associated with an active application and at least one audio submix is associated with an inactive application.

19. The one or more computing devices of claim 16 further storing executable instructions that, when executed, automatically adjusts an audio property based at least in part on an audio policy set for the computer.

20. The one or more computing devices of claim 16, wherein the plurality of classifications is selected from a group comprising:
  standard audio;
  operating system notification audio;
  game audio;
  media and entertainment audio; and
  voice communication audio.

* * * * *